United States Patent
Finders et al.

(10) Patent No.: US 7,256,873 B2
(45) Date of Patent: Aug. 14, 2007

(54) ENHANCED LITHOGRAPHIC RESOLUTION THROUGH DOUBLE EXPOSURE

(75) Inventors: Jozef Maria Finders, Veldhoven (NL); Donis George Flagello, Scottsdale, AZ (US); Steven George Hansen, Phoenix, AZ (US)

(73) Assignee: ASML Netherlands B.V., Veldhoven (NL)

( * ) Notice: Subject to any disclaimer, the term of this patent is extended or adjusted under 35 U.S.C. 154(b) by 153 days.

(21) Appl. No.: 10/765,218

(22) Filed: Jan. 28, 2004

(65) Prior Publication Data

US 2005/0162627 A1    Jul. 28, 2005

(51) Int. Cl.
    *G03B 27/32*     (2006.01)
    *G03B 27/42*     (2006.01)
    *G03B 27/54*     (2006.01)

(52) U.S. Cl. ............................. 355/77; 355/53; 355/67
(58) Field of Classification Search ................... 355/40, 355/53, 67, 77; 430/5, 30
See application file for complete search history.

(56) References Cited

U.S. PATENT DOCUMENTS

| | | | |
|---|---|---|---|
| 5,111,240 A * | 5/1992 | Boettiger et al. | 355/53 |
| 5,229,872 A | 7/1993 | Mumola | |
| 5,296,891 A | 3/1994 | Vogt et al. | |
| 5,415,835 A | 5/1995 | Brueck et al. | |
| 5,523,193 A | 6/1996 | Nelson | |
| 5,563,012 A | 10/1996 | Neisser | |
| 5,705,321 A | 1/1998 | Brueck et al. | |
| 5,969,441 A | 10/1999 | Loopstra et al. | |
| 6,042,998 A | 3/2000 | Brueck et al. | |
| 6,046,792 A | 4/2000 | Van Der Werf et al. | |
| 6,122,035 A * | 9/2000 | Rolson | 355/53 |
| 6,320,648 B1 | 11/2001 | Brueck et al. | |
| 6,511,794 B1 * | 1/2003 | Furukawa | 430/328 |
| 6,558,881 B2 * | 5/2003 | Tokushima | 430/394 |
| 6,636,294 B2 * | 10/2003 | Kochi | 355/53 |

(Continued)

FOREIGN PATENT DOCUMENTS

WO     WO98/40791     9/1998

OTHER PUBLICATIONS

Ooki et al., "A Novel Super-Resolution Technique for Optical Lithography—Nonlinear Multiple Exposure Method," *Jpn. J. Appl. Phys.* 33:L177-L179 (1994).

*Primary Examiner*—W. B. Perkey
*Assistant Examiner*—Kevin Gutierrez
(74) *Attorney, Agent, or Firm*—Pillsbury Winthrop Shaw Pittman LLP

(57) ABSTRACT

A system and method for enhancing the image resolution in a lithographic system, is presented herein. The invention comprises decomposing a reticle pattern into at least two constituent sub-patterns that are capable of being optically resolved by the lithographic system, coating a substrate with a pre-specified photoresist layer, and exposing a first of the at least two constituent sub-patterns by directing a projection beam through the first sub-pattern such that the lithographic system produces a first sub-pattern image onto the pre-specified photoresist layer of the substrate. The invention further comprises processing the exposed substrate, exposing a second of the at least two constituent sub-patterns by directing the projection beam through the second sub-pattern such that the lithographic system produces a second sub-pattern image onto the pre-specified photoresist layer of the substrate, and then combining the first and second sub-pattern images to produce a desired pattern on the substrate.

11 Claims, 5 Drawing Sheets

U.S. PATENT DOCUMENTS

| | | |
|---|---|---|
| 2002/0025019 A1* | 2/2002 | Amemiya et al. ............ 378/34 |
| 2002/0106818 A1* | 8/2002 | Adachi et al. ................ 438/14 |
| 2002/0145712 A1* | 10/2002 | Kochi ......................... 355/53 |
| 2002/0182549 A1 | 12/2002 | Chang et al. |
| 2003/0039893 A1 | 2/2003 | Farnsworth et al. |
| 2003/0044722 A1* | 3/2003 | Hsu et al. ................... 430/312 |
| 2003/0064307 A1* | 4/2003 | Nakamura et al. ............ 430/22 |
| 2003/0103196 A1* | 6/2003 | Hirukawa .................... 355/55 |
| 2003/0123040 A1* | 7/2003 | Almogy ....................... 355/69 |
| 2004/0009434 A1* | 1/2004 | Lin et al. .................... 430/312 |

* cited by examiner

For Target Pattern T & $p_{T0.5}$
$k_T < 0.25$

Target Sub-Pattern $T_1$ & $p_{T10.5}$
$k_{T1} > 0.25$

Target Sub-Pattern $T_2$ & $p_{T20.5}$
$k_{T2} > 0.25$

ENHANCED LITHOGRAPHIC RESOLUTION THROUGH DOUBLE EXPOSURE

BACKGROUND OF THE INVENTION

1. Field of the Invention

The present invention generally relates to photolithography and associated methods and apparatus for exposing semiconductor substrates.

2. Description of the Related Art

Lithographic exposure apparatuses can be used, for example, in the manufacture of integrated circuits (ICs). In such a case, a patterning device may generate a circuit pattern corresponding to an individual layer of the IC, and this pattern can be imaged onto a target portion (e.g. comprising one or more dies) on a substrate (silicon wafer) that has been coated with a layer of photo-activated resist (i.e., photoresist) material. In general, a single wafer will contain a whole network of adjacent target portions that are successively irradiated via the projection system, one at a time.

The term "patterning device" as will be employed herein should be broadly interpreted to refer to a device that can be used to endow an incoming radiation beam with a patterned cross-section, corresponding to a pattern that is to be created in a target portion of the substrate. The term "light valve" may also be used in this context. Generally, the pattern will correspond to a particular functional layer in a device being created in the target portion, such as an integrated circuit or other device (see below). Examples of such patterning devices include:

(a) a mask: the concept of a mask or reticle is well known in lithography, and it includes reticle types such as binary, alternating phase-shift, and attenuated phase-shift, as well as various hybrid reticle types. Placement of such a reticle in the radiation beam causes selective transmission (in the case of a transmissive mask) or reflection (in the case of a reflective mask) of the radiation impinging on the reticle, according to the pattern on the reticle. In the case of a reticle, the support structure will generally be a reticle table, which ensures that the reticle can be held at a desired position in the incoming radiation beam, and that it can be moved relative to the beam if so desired;

(b) a programmable mirror array: an example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the support structure may be embodied as a frame or table, for example, which may be fixed or movable as required; and (c) a programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a reticle and reticle table; however, the general principles discussed in such instances should be seen in the broader context of the patterning devices as set forth above. Also, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

In current apparatuses, employing patterning by a reticle on a reticle table, a distinction can be made between two different types of machine. In one type of lithographic exposure apparatus, each target portion is irradiated by exposing the entire reticle pattern onto the target portion in one go; such an apparatus is commonly referred to as a wafer stepper. In an alternative apparatus—commonly referred to as a step-and-scan apparatus—each target portion is irradiated by progressively scanning the reticle pattern under the projection beam in a given reference direction (the "scanning" direction) while synchronously scanning the substrate table parallel or anti-parallel to this direction. Because, in general, the projection system will have a magnification factor M (generally <1), the speed V at which the substrate table is scanned will be a factor M times that at which the reticle table is scanned. More information with regard to lithographic devices as here described can be gleaned, for example, from U.S. Pat. No. 6,046,792, incorporated herein by reference.

It is to be noted that the lithographic apparatus may also be of a type having two or more substrate tables (and/or two or more reticle tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

It will be appreciated that the wafer substrates Ws may be subjected to a variety of processes before lithographic apparatus exposes the reticle RE circuit pattern onto the wafer substrate W. For example, the wafer substrates Ws may be treated or coated with a layer of photo-activated resist (i.e. photoresist) material before exposure. Moreover, prior to exposure, the substrates Ws may also be subjected to cleaning, etching, ion implantation (e.g., doping), metallization, oxidation, chemo-mechanical polishing, priming, soft bake processes, and measurement processes.

The wafer substrates Ws may also be subjected to a host of post-exposure processes, such as, for example, post exposure bake (PEB), development, hard bake, etching, ion implantation (e.g., doping), metallization, oxidation, chemo-mechanical polishing, cleaning, and measurement processes. And, if several layers for each wafer substrate W is required, which is usually the case, the entire procedure, or variants thereof, will have to be repeated for each new layer.

The continual demand for smaller semiconductor devices, having smaller patterns and features on the wafer substrate, is pushing the limits on the optical resolution that can be achieved by lithographic exposure apparatus. Generally, the smallest size of repeatable feature (e.g., "half-pitch") of a pattern exposed on wafer substrate W that can be optically resolved by lithographic exposure apparatus, depends on attributes of the projection lens PL and projection beam PB. In particular, the optical resolution for half-pitch feature size may be derived by using the simplified form of the Rayleigh resolution equation:

$$k_1 = p_{0.5} \cdot NA/\lambda \geq 0.25 \quad (1)$$

where:

$p_{0.5}$ represents the repeatable feature size (e.g., "half-pitch") in nm;

NA represents the numerical aperture of projection lens PL;

$\lambda$ represents the wavelength of projection beam PB; and $k_1$ represents the optical resolution limit for half-pitch feature size.

As indicated above, the theoretical optical resolution half-pitch lower limit $k_1$ for 2-beam imaging, is 0.25. In an attempt to circumvent the $k_1$=0.25 barrier, considerable efforts have been directed to develop expensive technologies that are capable of employing shorter wavelengths and/or higher numerical apertures, thus allowing production of smaller features while not violating the $k1 \geq 0.25$ constraint.

SUMMARY OF THE INVENTION

Systems, apparatuses and methods consistent with the principles of the present invention, as embodied and broadly described herein, provide for the enhancement of image resolution in a lithographic system. One embodiment of the present invention comprises decomposing a reticle pattern into at least two constituent sub-patterns that are capable of being optically resolved by the lithographic system, coating a substrate with a pre-specified photoresist layer, and exposing a first of the at least two constituent sub-patterns by directing a projection beam through the first sub-pattern such that the lithographic system produces a first sub-pattern image onto the pre-specified photoresist layer of the substrate. The invention further comprises processing the exposed substrate, exposing a second of the at least two constituent sub-patterns by directing the projection beam through the second sub-pattern such that the lithographic system produces a second sub-pattern image onto the pre-specified photoresist layer of the substrate, and then combining the first and second sub-pattern images to produce a desired pattern on the substrate.

Although specific reference may be made in this text to the use of the apparatus according to the invention in the manufacture of IC's, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc.

BRIEF DESCRIPTION OF THE DRAWINGS

Embodiments of the invention will now be described, by way of example only, with reference to the accompanying schematic drawings in which.

In the figures, corresponding reference symbols indicate corresponding parts.

DETAILED DESCRIPTION

Lithographic Projection Apparatus

Figure 1:
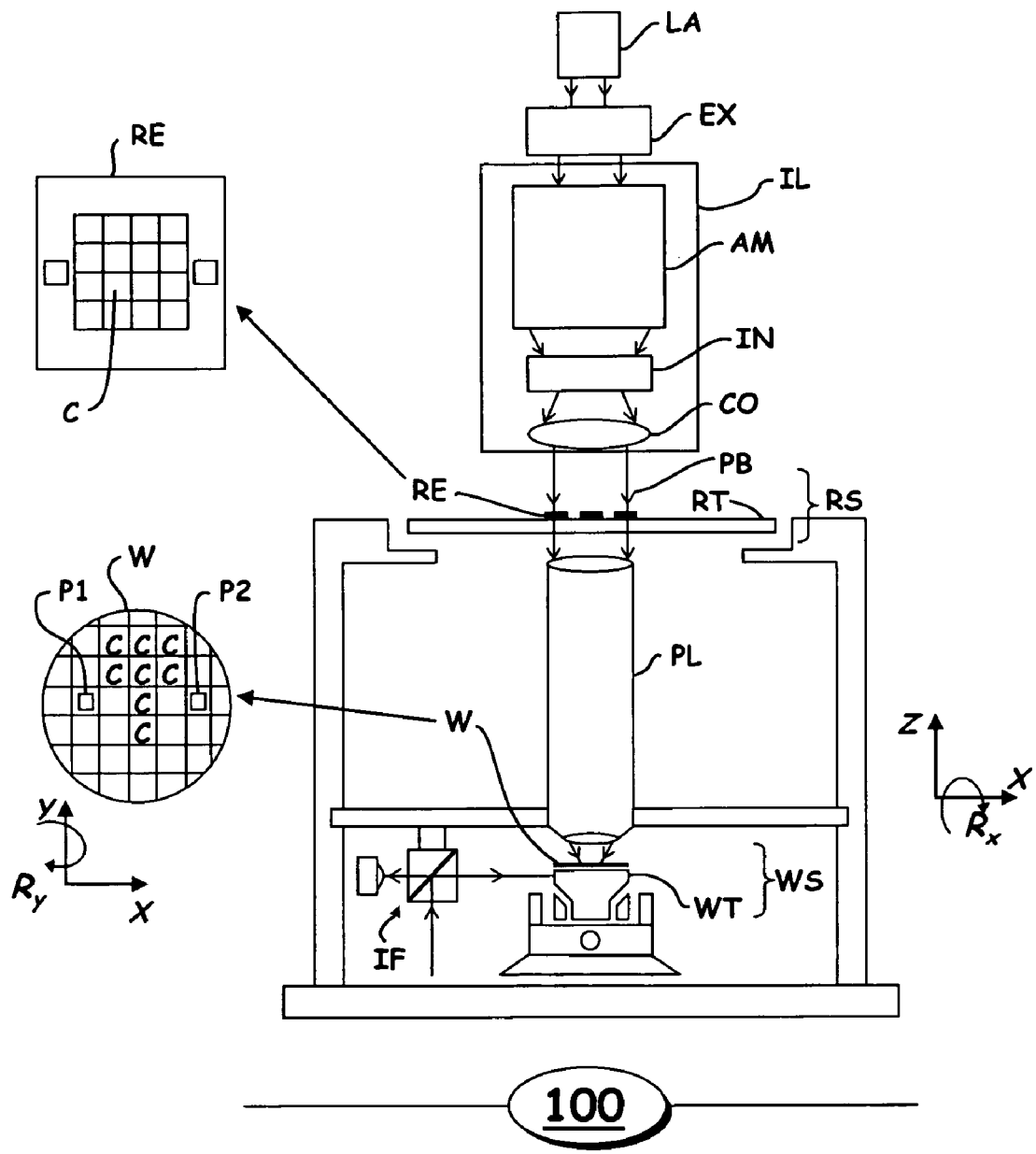
FIG. 1 is a schematic illustration of a lithographic system in accordance with the present invention.

FIG. 1 schematically depicts a lithographic apparatus 100 according to a particular embodiment of the invention. Lithographic apparatus 100 comprises a radiation source LA and radiation system IL for providing projection beam PB, a first object table (e.g. reticle table) RT provided with a reticle holder for holding a reticle RE, and a projection system PL (e.g., lens) for imaging an irradiated portion of the reticle RE onto a target portion C (e.g. comprising one or more dies) of the substrate W. The combination of the reticle RE, reticle table RT, and reticle-related components are commonly referred to as the reticle stage RS.

As depicted, lithographic apparatus 100 is of a transmissive type (i.e. has a transmissive mask). However, in general, it may also be of a reflective type (with a reflective mask) and, alternatively, apparatus 100 may employ another kind of patterning device, such as a programmable mirror array of a type as indicated above The projection beam PB may encompass different types of electromagnetic radiation including, but not limited to, ultraviolet radiation (UV) and extreme ultra-violet radiation (EUV), as well as particle beams, such as ion beams or electron beams.

Lithographic apparatus 100 further comprises a second object table (e.g., wafer substrate table) WT provided with a substrate holder for holding a wafer substrate W (e.g. a resist-coated silicon wafer). The combination of the wafer substrate W, wafer table WT, and wafer-related components are commonly referred to as the wafer substrate stage WS.

Source LA produces a beam of radiation, which is fed into illumination system (e.g., illuminator) IL, either directly or after having traversed conditioning mechanism, such as a beam expander EX, for example. Illuminator IL may comprise adjusting mechanism AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the reticle RE has a desired cross-sectional uniformity and intensity distribution.

Projection beam PB subsequently intercepts the reticle RE, which is held on a reticle table RT. The reticle table RT and/or the reticle stage RS may contain an actuating mechanism for adjusting the position of the reticle table RT, including height, tilt, rotational, and level positions. Having traversed the reticle RE, the beam PB passes through the lens PL, which focuses the beam PB onto a target portion C of the wafer substrate W. With the aid of the second positioning mechanism (and interferometric measuring mechanism IF), the substrate table WT can be moved accurately (e.g. so as to position different target portions C in the path of the beam PB). Similarly, the first positioning mechanism can be used to accurately position the reticle RE with respect to the path of the beam PB (e.g. after mechanical retrieval of the reticle RE from a reticle library, or during a scan).

In general, movement of the object tables RT, WT will be realized with the aid of a long-stroke module and a short-stroke module, which are not explicitly depicted in FIG. 1. However, in the case of a wafer stepper (as opposed to a step-and-scan apparatus), the reticle table RT may just be connected to a short stroke actuator, or may be fixed.

Lithographic apparatus 100 may operate in different modes:

(a) step mode: reticle table RT is kept essentially stationary, and an entire reticle image is projected in one go (i.e. a single "flash") onto a target portion C. The substrate table WT is then shifted in the x and/or y directions so that a different target portion C can be irradiated by the beam PB;

(b) scan mode: essentially the same scenario applies, except that a given target portion C is not exposed in a single "flash". Instead, reticle table RT is movable in a given direction (the so-called "scan direction", e.g. the y direction) with a speed v, so that projection beam PB is caused to scan over a reticle image. Concurrently, substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution; and other mode: the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Embodiments

As noted above, their exists a constant need to achieve finer optical resolutions and circumventing the theoretical half-pitch lower limit $k_1$ of 0.25 would provide an important advantage. Without this possibility, to achieve resolutions below this limit, efforts must concentrate on the development of expensive technologies that employ shorter wavelengths and/or higher numerical apertures.

As described in greater detail below, however, the present invention achieves resolutions lower than the half-pitch lower limit $k_1$ of 0.25 by implementing a combination of multiple exposure techniques and reduced memory photoresist reaction processes. In particular, the disclosed invention takes advantage of the fact that appropriate photoresist processes can lock-in high contrast latent images while dissipating unwanted remnants of the optical exposure, and with multiple exposures yield half-pitch feature sizes smaller than what would otherwise be feasible under conventional lithographic processes.

Figure 2A:
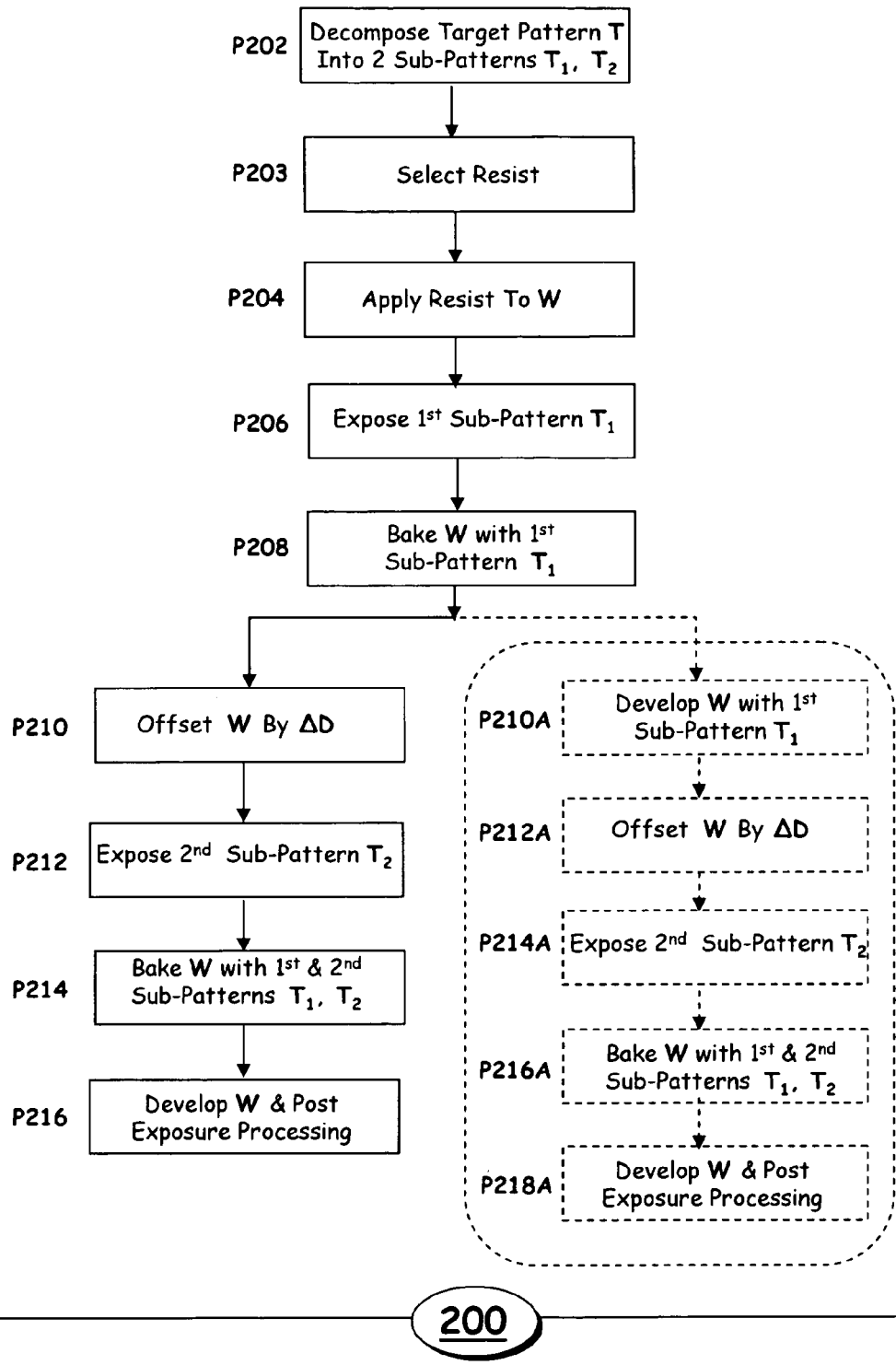
FIG. 2A is a functional flow diagram depicting an embodiment of the present invention.
Figure 2B:
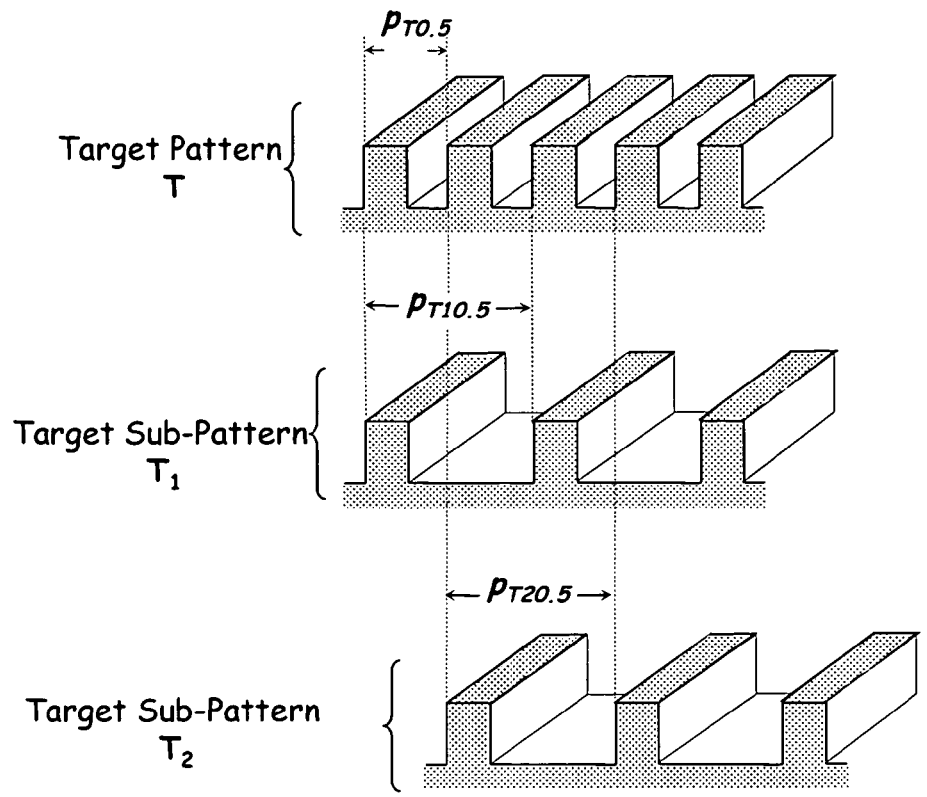
FIG. 2B is a schematic illustration of a target reticle pattern and decomposed sub-patterns, in accordance with the present invention.

The functional flow diagram of FIG. 2A depicts the general inventive concept of enhanced optical resolution process 200, constructed and operative in accordance with a particular embodiment of the present invention. As indicated in FIG. 2A, process 200 commences with procedure task P202, which involves the decomposition of target pattern T. Target pattern T contains a half-pitch feature size $p_{0.5}$ smaller than what can be accommodated by lithographic apparatus 100. In other words, as depicted in FIG. 2B, the half-pitch feature size $p_{0.5}$ of target pattern T corresponds to optical resolutions that are too small (e.g., $k_1 < 0.25$). As such, process 200 exploits the configuration of the features of target pattern T to split or decompose the features into at least two constituent sub-patterns $T_1$, $T_2$. As illustrated in FIG. 2B, each constituent sub-pattern $T_1$, $T_2$ is arranged in a manner that can be optically resolved by lithographic apparatus 100 (i.e., $k_1 > 0.25$ for both $T_1$, $T_2$) and can be subsequently combined, interleaved, or otherwise superimposed to render the desired target pattern T.

Returning to FIG. 2A, process 200 progresses to procedure task P203 to select the photoresist to be applied to the wafer substrate W. In one embodiment, the photoresist selected enables the creation of a high contrast latent image while exhibiting reduced memory reaction characteristics. A reduced memory photoresist reaction process refers to a process in which the effects of an initial exposure on the photoresist are, to a certain extent, dissipated.

Figure 3A:
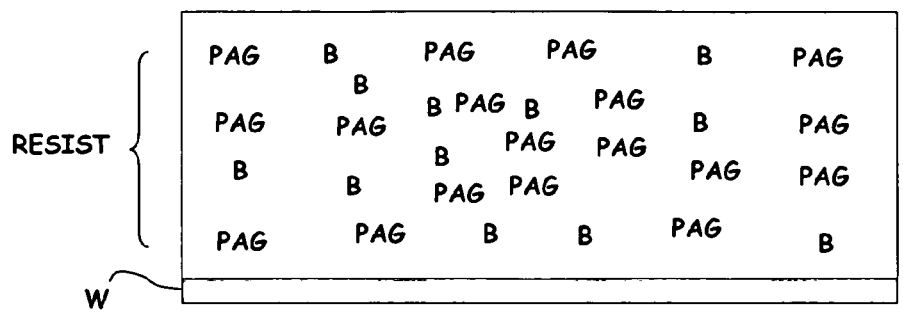
FIGS. 3A–3C schematically illustrate photoresist interactions during various lithographic processes, in accordance with an embodiment of the present invention.
Figure 3B:
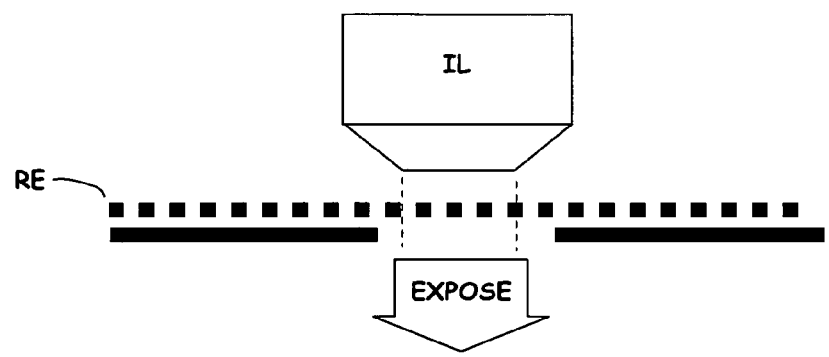
Figure 3B:
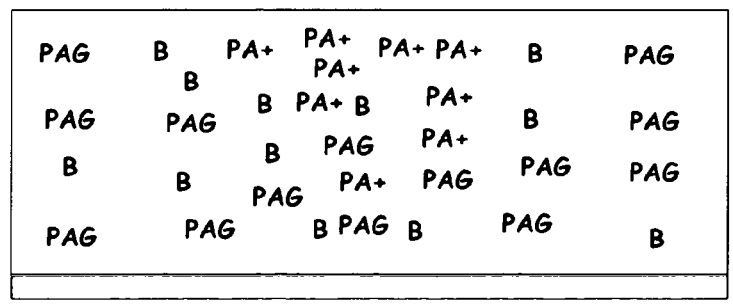

For example, a photoresist capable of providing high contrast latent images while having reduced reaction memory properties comprises a photo-acid generator PAG as well as a base B compound in a blocked matrix configuration, as illustrated in FIG. 3A. In this configuration, after exposure, photo-acid generator PAG is converted into a photo-acid PA+, of which some is neutralized by the base B compound, as depicted in FIG. 3B.

Figure 3C:
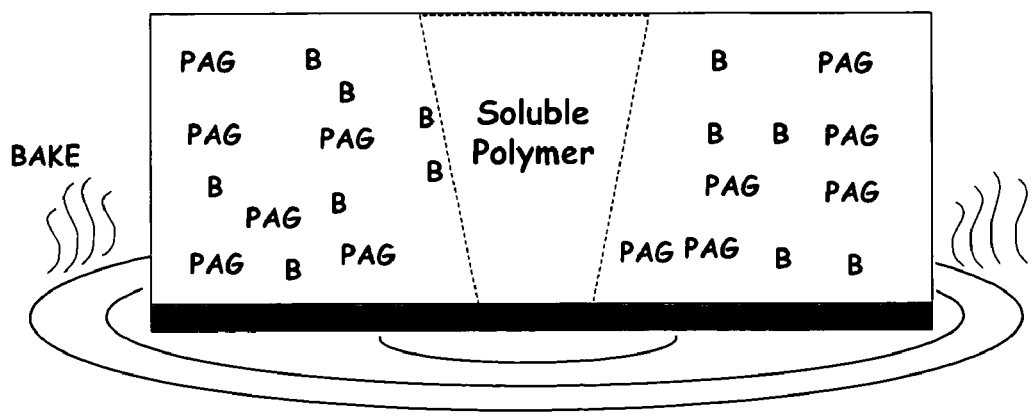
Figure 3D:
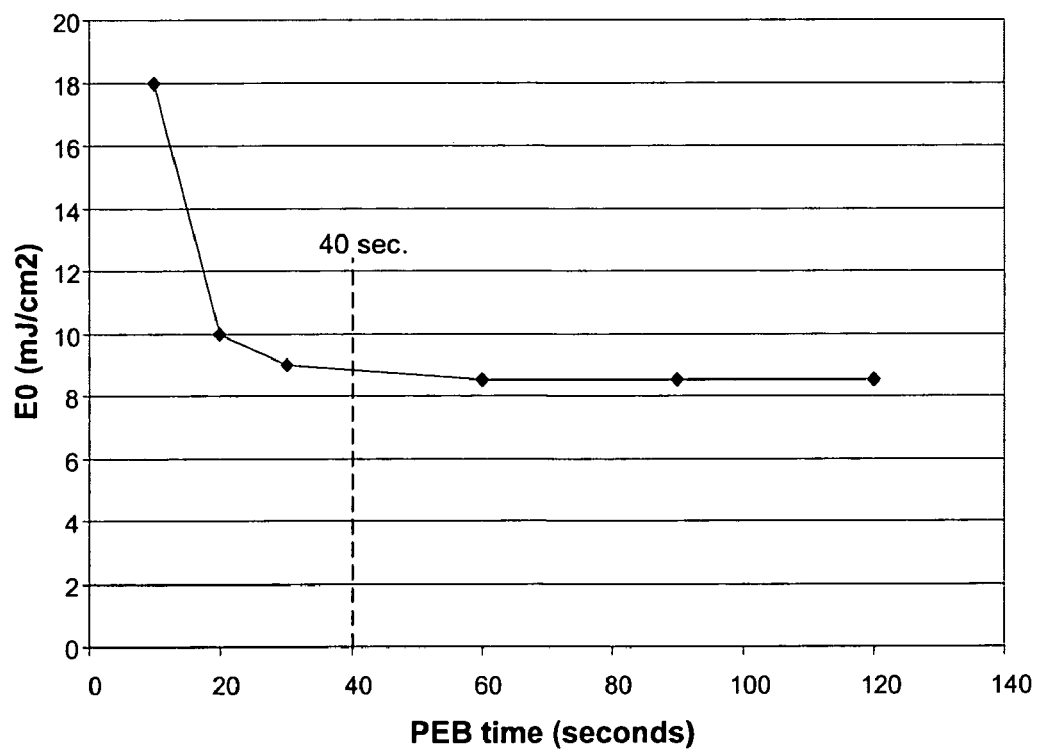
FIG. 3D charts energy information vs. baking interval, in accordance with the present invention.

During the baking process, a reaction is catalyzed between the photo-acid PA+ and the polymer so that, after baking, the polymer is deblocked, rendering it soluble in typical developer solutions, and the photo-acid PA+ is largely dissipated, as illustrated in FIG. 3C. An example showing that photo-induced polymer deblocking reaction ceases, i.e. loses memory of the initial exposure, is shown in FIG. 3D. Here, after approximately 40 seconds of baking time, the chemical reactions occurring between the photo-acid PA+ and the polymer are reduced such that the extent of polymer deblocking does not increase with longer baking times. Thus, for this case, after a 40 sec. baking interval, the photo-acid PA+ virtually dissipates to provide a relatively high contrast and stable latent image on a photoresist that has little memory of any preceding exposures.

These dissipation characteristics will vary depending on the photoresist processing conditions, specifically bake time and temperature, and on the photoresist's chemical composition. It will be appreciated that baking time and temperature, as well as the composition of the photoresist, may be optimized to yield better and/or more consistent In other embodiments, photoresist materials having non-linear responses, such as thermal resist material or equivalents, may be used to achieve these properties.

Upon selecting the photoresist, process 200 advances to procedure block P204, where wafer substrate W is directed to a pre-processing station or module configured to apply the selected photoresist. Wafer substrate W is then coated with the selected photoresist.

After coating, process 200 advances to procedure block P206, where wafer substrate W is directed to lithographic apparatus 100 for exposing the first sub-pattern $T_1$ onto substrate W. After this first exposure, process 200 advances to procedure block P208, where substrate W directed to a baking station (e.g., PEB), where substrate W is baked for a predetermined interval of time (e.g., 60 sec.). As noted above, exposing and baking the substrate W "locks in" the features of the first sub-pattern $T_1$ on the photoresist to provide a relatively high contrast and stable latent image.

Upon baking, process 200 progresses to procedure block P210, where wafer substrate W is directed back to lithographic apparatus 100, where the substrate W is shifted or offset by a predetermined distance $\Delta D$. Predetermined distance $\Delta D$ corresponds to the shift necessary to adequately image the features of the second sub-pattern $T_2$ on the photoresist to obtain the target image T. In other words, the offset of distance $\Delta D$ is determined so that when the second sub-pattern $T_2$ is imaged on the photoresist, the features of the second sub-pattern $T_2$ are properly aligned with the features of the already-imaged first sub-pattern $T_1$. In this manner, the superposition of the second sub-pattern $T_2$ on the photoresist having the already-imaged first sub-pattern $T_1$, yields the original desired target pattern T.

After offsetting wafer substrate W by predetermined distance $\Delta D$, processes 200 moves to procedure block P212, where wafer substrate W is directed to lithographic apparatus 100 for exposing the second sub-pattern $T_2$ onto substrate W. After this second exposure, process 200 advances to procedure block P214, where substrate W directed to a baking station (e.g., PEB), where substrate W is baked for a predetermined interval of time to lock in the features of the second sub-pattern $T_2$ on the photoresist. The substrate W is subsequently directed to a development station and other post-exposure processes, as indicated in procedure block P216, where a developer solution is applied to the substrate W to remove the unexposed photoresist material and prepare the substrate W for further processing, such as, for example, hard baking, etching, doping, metallization, and polishing.

In an alternative embodiment, indicated by the dashed lines of FIG. 2A, after procedure task P208, which directs the baking of the wafer substrate W having sub-pattern $T_1$ imaged on the photoresist, process 200 progresses to procedure block P210A, where wafer substrate W is directed a development station that applies a developing solution to substrate W to remove the exposed photoresist material associated with the exposure of the first sub-pattern $T_1$. Then, in procedure task P212A, the substrate W is directed back to lithographic apparatus 100, where the substrate W is shifted or offset by a predetermined distance $\Delta D$. As noted above, predetermined distance $\Delta D$ corresponds to the shift necessary to adequately image the features of the second sub-pattern $T_2$ on the photoresist in order to superimpose the second sub-pattern $T_2$ features in between the features of the already-imaged first sub-pattern $T_1$ so as to render the original desired target pattern T.

After offsetting wafer substrate W by predetermined distance $\Delta D$, process 200 moves to procedure block P214A, where wafer substrate W is directed to lithographic apparatus 100 for exposing the second sub-pattern $T_2$ onto substrate W. After this second exposure, process 200 advances to procedure block P216A, where substrate W directed to a baking station (e.g., PEB), where substrate W is baked for a predetermined interval of time to lock in the features of the second sub-pattern $T_2$ on the photoresist.

The substrate W is subsequently directed, once again, to a development station and other post-exposure processes, as indicated in procedure block P218A, where a developer solution is applied to the substrate W to remove the exposed photoresist material associated with the exposure of the second sub-pattern $T_2$ and to prepare the substrate W for further processing.

In this manner, the disclosed invention is capable of exploiting the fact that patterns can be decomposed into two or more patterns with greater minimum half-pitch, multiple exposure techniques, and photoresist materials having reduced reaction memory to provide high contrast latent images having half-pitch feature sizes $p_{0.5}$ smaller than what would otherwise be feasible under conventional lithographic processes.

The preceding detailed description refers to the accompanying drawings that illustrate exemplary embodiments consistent with the present invention. Other embodiments are possible and modifications may be made to the embodiments without departing from the spirit and scope of the invention. For example, the embodiments described above may, instead, be implemented in different embodiments of software, firmware, and hardware in the entities illustrated in the figures.

As such, the operation and behavior of the present invention has been described with the understanding that modifications and variations of the embodiments are possible, given the level of detail present herein. Thus, the above detailed description is not meant or intended to limit the invention—rather the scope of the invention is defined by the appended claims.

What is claimed is:

1. A device manufacturing method with a lithographic system, the method comprising:
    providing a substrate coated with a photoresist layer having reduced memory reaction characteristics;
    providing a beam radiation;
    employing a patterning device to impart said beam of radiation with a pattern in its cross-section in which said pattern is decomposed into at least two constituent sub-patterns;
    exposing a first of said at least two constituent sub-patterns by directing said beam of radiation beam through said first sub-pattern such that said lithographic system produces a first sub-pattern image onto a target area of said pre-specified photoresist layer of said substrate;
    processing said exposed substrate;
    exposing a second of said at least two constituent sub-patterns by directing said beam of radiation through said second sub-pattern such that said lithographic system produces a second sub-pattern image onto said target area of said pre-specified photoresist layer of said substrate,
    wherein said exposing of the first of said at least two constituent sub-patterns and said exposing of the second of said at least two constituent sub-patterns combine said first and second sub-pattern images to produce a desired pattern on said target area of said substrate.

2. The device manufacturing method of claim 1, wherein a combination of said exposing of the first of said at least two constituent sub-patterns and said exposing of the second of said at least two constituent sub-patterns produce features in said desired pattern that correspond to a half-pitch lower limit $k_1$ less than or equal to 0.25.

3. The device manufacturing method of claim 1, wherein said processing includes,
    baking said substrate having said first sub-pattern image on said photoresist layer.

4. The device manufacturing method of claim 3, further including applying a developer solution to said substrate.

5. The device manufacturing method of claim 4, wherein said processing is optimized by employing specific bake times and temperatures such that said desired pattern includes features that correspond to a half-pitch lower limit $k_1$ less than or equal to 0.25.

6. The device manufacturing method of claim 1, wherein said photoresist layer further comprises a polymer resin compound, a photo-acid generator component, and a base component.

7. The device manufacturing method of claim 3, wherein said processing further includes, applying a developer solution to said substrate, and shifting said substrate by a predetermined distance, in order to combine said second sub-pattern image with said first sub-pattern image.

8. The device manufacturing method of claim 7, further including baking said substrate having said second sub-pattern image and a developed first sub-pattern image on said photoresist layer.

9. The device manufacturing method of claim 8, wherein said wherein said processing is optimized by employing specific bake times and temperatures such that said desired pattern includes features that correspond to a half-pitch lower limit $k_1$ less than or equal to 0.25.

10. The device manufacturing method of claim 9, wherein said photoresist layer further comprises a polymer resin compound, a photo-acid generator component, and a base component.

11. The method of claim 3, further comprising shifting said substrate before exposing the second of said at least two constituent sub-patterns by a predetermined distance in order to interleave said second sub-pattern image with said first sub-pattern image.

* * * * *